(12) United States Patent
Balcom et al.

(10) Patent No.: US 8,890,527 B1
(45) Date of Patent: Nov. 18, 2014

(54) METHODS OF RADIO FREQUENCY MAGNETIC FIELD MAPPING

(71) Applicant: University of New Brunswick, Fredericton (CA)

(72) Inventors: Bruce Balcom, Fredericton (CA); Sarah Vashee, Fredericton (CA); Ben Newling, Fredericton (CA); Bryce MacMillan, Oromocto (CA)

(73) Assignee: University of New Brunswick, Fredericton, New Brunswick (CA)

( * ) Notice: Subject to any disclaimer, the term of this patent is extended or adjusted under 35 U.S.C. 154(b) by 0 days.

(21) Appl. No.: 13/764,729

(22) Filed: Feb. 11, 2013

Related U.S. Application Data

(60) Provisional application No. 61/597,482, filed on Feb. 10, 2012.

(51) Int. Cl.
  *G01V 3/00* (2006.01)
  *G01R 33/565* (2006.01)

(52) U.S. Cl.
  CPC .................................. *G01R 33/565* (2013.01)
  USPC .......................................... 324/309; 324/307

(58) Field of Classification Search
  CPC ........................... G01R 33/246; G01R 33/5659
  USPC .................... 324/309, 307, 314, 312
  See application file for complete search history.

(56) References Cited

U.S. PATENT DOCUMENTS

| | | | |
|---|---|---|---|
| 6,794,870 B2 | 9/2004 | Hennig | |
| 6,969,991 B2 | 11/2005 | Bammer et al. | |
| 7,064,546 B2 * | 6/2006 | Feiweier | 324/307 |
| 7,309,986 B2 | 12/2007 | Epstein et al. | |
| 7,446,526 B2 * | 11/2008 | Cunningham et al. | 324/307 |
| 7,705,596 B2 | 4/2010 | Witschey et al. | |
| 7,911,208 B2 | 3/2011 | Reisman | |
| 8,305,077 B2 * | 11/2012 | Morrell | 324/309 |
| 8,502,538 B2 * | 8/2013 | Dannels et al. | 324/318 |
| 8,558,547 B2 * | 10/2013 | Sacolick et al. | 324/318 |

OTHER PUBLICATIONS

O. Petrov & B. Balcom, "Two-Dimensional T2 Distribution Mapping in Porous Solids with Phase Encode MRI," J. Magn. Reson. 212(1): 102-108, Sep. 2011.

O. Petrov, et al., "T2 Distribution Mapping Profiles with Phase-Encode MRI," J. Magn. Reson. 209(1): 39-46, Feb. 2011.

L. Li, et al., "Flow Imaging of Fluids in Porous Media by Magnetization Prepared Centric-Scan SPRITE," J. Magn. Reson., 197(1): 1-8, Mar. 2009.

Q. Chen & B. Balcom, "Measurement of Rock-Core Capillary Pressure Curves using a Single-Speed Centrifuge and One-Dimensional Magnetic-Resonance Imaging," J. Chem. Phys. 122(21): 214720, Jun. 2005.

D. Hoult & R. Richards, "The Signal-to-Noise Ratio of the Nuclear Magnetic Resonance Experiment," J. Magn. Reson. 24(1): 71-85, Oct. 1976.

D. Hoult, "The Principle of Reciprocity in Signal Strength Calculations—A Mathematical Guide," Concepts Magn. Reson. 12(4): 173-187, Jun. 2000.

(Continued)

*Primary Examiner* — Louis Arana

(74) *Attorney, Agent, or Firm* — Eugene F. Derényi; Fogler, Rubinoff LLP

(57) ABSTRACT

Methods for measuring $B_1$ values in an MRI sample space, generating $B_1$ maps and using $B_1$ maps to correct $B_1$ profiles are disclosed.

11 Claims, 16 Drawing Sheets

(56) References Cited

OTHER PUBLICATIONS

D. Hoult, "The NMR Receiver: A Description and Analysis of Design," (vol. 12). N.p.: Pergamon Press. (1978).
H. Mihara, et al., "A Method of RF Inhomogeneity Correction in MR Imaging," MAGMA 7(2): 115-120, Dec. 1998.
S. Volz, et al., "A Fast B1-Mapping Method for the Correction and Normalization fo Magnetization Transfer Ratio Maps at 3 T," Neuroimage 49(4): 3015-3026, Feb. 2010.
C. Sinclair, et al., "Correcting Radio Frequency Inhomogeneity Effects in Skeletal Muscle Magnetisation Transfer Maps," NMR Biomed 25(2): 262-270, Feb. 2012.
J. Wang, et al., "Measurement and Correction of Transmitter and Receiver Induced Nonuniformities In Vivo," Magn. Reson. Med. 53(2): 408-417, Feb. 2005.
E. McVeigh, et al., "Phase and Sensitivity of Receiver Coils in Magnetic Resonance Imaging," Med. Phys. 13(6): 806-814 (1986).
F. Zelaya, et al., "Direct Visualisation of B1 Inhomogeneity by Flip Angle Dependency," Magn. Reson. Imaging 15(4): 497-504 (1997).
E. Insko & L. Bolinger, "Mapping of the Radiofrequency Field," J. Magn. Reson.-A 103: 82-85 (1993).
R. Treier, et al., "Optimized and Combined T1 and b1 Mapping Technique for Fast and Accurate T1 Quantification in Contrast-Enhanced Abdominal MRI," Magn. Reson. Med. 57(3):568-576, Mar. 2007.
R. Stollberger & P. Wach, "Imaging of the Active B1 Field In Vivo," Magn. Reson. Med. 35(2): 246-251, Feb. 1996.
C. Cunningham, et al., "Saturated Double-Angle Method for Rapid B1+ Mapping," Magn. Reson. Med. 55(6): 1326-1333, Jun. 2006.
S. Akoka, et al., "Radiofrequency Map of an NMR Coil by Imaging," Magn. Reson. Imaging 11(3): 437-441 (1993).
A. Haase, "Snapshot Flash MRI. Applications to T1, T2, and Chemical-Shift Imaging," Magn. Reson. Med. 13(1): 77-89, Jan. 1990.
V. Yarnykh, "Actual Flip-Angle Imaging in the Pulsed Steady State: A Method for Rapid Three-Dimensional Mapping of the Transmitted Radiofrequency Field," Magn. Reson. Med. 57(1): 192-200, Jan. 2007.
K. Nehrke, "On the Steady-State Properties of Actual Flip Angle Imaging (AFI)," Magn. Reson. Med. 61(1): 84-92, Jan. 2009.
G. Morrell, "A Phase-Sensitive Method of Flip Angle Mapping," Magn. Reson. Med. 60(4): 889-894, Oct. 2008.
N. Dowell & P. Tofts, "Fast, Accurate, and Precise Mapping of the RF Field In Vivo Using the 180 Degrees Signal Null," Magn. Resoin. Med. 58(3): 622-630, Sep. 2007.
L. Sacolick, et al., "B1 Mapping by Bloch-Siegert Shift," Magn. Reson. Med. 63(5): 1315-1322, May 2010.
F. Bloch & A. Siegert, "Magnetic Resonance for Nonrotating Fields," Phys. Rev. 57(6): 522-527 (1940).
K. Nagashima, "B1 Mapping of Liquid NMR Transversal RF Coils: Analysis of Heterogeneity and Nonlinearity," Concepts Magn. Resonance 41B(1): 1-12, Feb. 2012.
M. Halse, et al., "Centric Scan SPRITE Magnetic Resonance Imaging," J. Magn. Reson. 165(2): 219-229, Dec. 2003.
M. Halse, et al., "Centric Scan SPRITE Magnetic Resonance Imaging: Optimization of SNR, Resolution, and Relaxation Time Mapping," J. Magn. Reson. 169(1): 102-117, Jul. 2004.
Q. Chen, et al., "Centric Scan SPRITE for Spin Density Imaging of Short Relaxation Time Porous Materials," Magn. Reson. Imaging 23(2): 263-266, Feb. 2005.
C. Meyer, et al., "Retrospective Correction of Intensity Inhomogeneities in MRI," IEEE Trans. Med. Imaging 14(1): 36-41, Mar. 1995.
Z. Hou, "A Review on MR Image Intensity Inhomogeneity Correction," Inter. J. Biomed. Imaging 2006, ID 49515, pp. 1-11.
P. Irarrazabal, et al., "Inhomogeneity Correction Using an Estimated Linear Field Map," Magn. Reson Med. 35(2): 278-282, Feb. 1996.
M. Cohen, "Rapid and Effective Correction of RF Inhomogeneity for High Field Magnetic Resonance Imaging," Hum. Brain. Mapp. 10(4): 204-211, Aug. 2000.
J. Gispert, et al., "Method for Bias Field Correction of Brain T1-Weighted Magnetic Resonance Images Minimizing Segmentation Error," Hum. Brain Mapp. 22(2): 133-144, Jun. 2004.
K. Minard & R. Wind, "Solenoidal Microcoil Design. Part I: Opimizing RF Homogeneity and Coil Dimensions," Concepts Magn. Reson. 13(2): 128-142, Jan. 2001.
H. Han, et al., "High Pressure Magnetic Resonance Imaging with Metallic Vessels," J. Magn. Reson. 213(1): 90-97, Dec. 2011.
J. Hornak, et al., "Magnetic Field Mapping," Magn, Reson. Med. 6(2): 158-163, Feb. 1988.
W. Liu, et al., "Effects of End-Ring/Shield Configuration on Homogeneity and Signal-to-Noise Ratio in a Birdcage-Type Coil Loaded with a Human Head," Magn. Reson. Med. 51(1): 217-221, Jan. 2004.
M. Alecci, et al., "Radio Frequency Magnetic Field Mapping of a 3 Tesla Birdcage Coil: Experimental and Theoretical Dependence on Sample Properties," Magn. Resoin. Med. 46(2): 379-385, Aug. 2001.
C. Hayes, et al., "An Efficient, Highly Homogeneous Radiofrequency Coil for Whole-Body NMR Imaging at 1.5 T," J. Magn. Reson. 63(3) 622-628 (1985).
M. Leifer, "Theory of the Quadrature Elliptic Birdcage Coil," Magn. Reson. Med. 38(5): 726-732, Nov. 1997.
C. Hayes, "Birdcage Resonators: Highly Homogeneous Radiofrequency Coils for Magnetic Resonance," eMagRes (2007).
F. Doty, et al., "Practical Aspects of Birdcage Coils," J. Magn. Reson. 138(1): 144-154, May 1999.
J. Mispelter, "NMR Probeheads for Biophysical and Biomedical Experiments," vol. 12, pp. 371-400, N.p.: Imperial College Press (2007).
C. Wang & Gary X. Shen, "B1 Field, SAR, and SNR Comparisons for Birdcage TEM," and Microstrip Coils at 7T, J. Magn. Reson. Imaging 24(2): 439-443, Aug. 2006.
C. Collins, et al., "A Method for Accurate Calculation of B1 Fields in Three Dimensions. Effects of Shield Geometry on Field Strength and Homogeneity in the Birdcage Coil," J. Magn. Reson. 125(2): 233-241, Apr. 1997.
I. Mastikhin, et al., "SPRITE MRI with Prepared Magnetization and Centric k-Space Sampling," J. Magn. Reson. 136 (2): 159-168, Feb. 1999.
D. Hoult, "The Sensitivity of the Zeugmatographic Experiment Involving Human Samples," J. Magn. Reson. 34(2): 425-433, May 1979.
D. Gadian & F. Robinson, "Radiofrequency Losses in NMR Experiments on Electrically Conducting Samples," J. Magn. Reson. 34(2): 449-455 (1979).
P. Styles, "Sensitivity, Probe Design, and Spatial Localization for in Vivo NMR, in B. Maraviglia," Physics of NMR Spectroscopy in Biology and Medicine (1988). N.p. North-Holland.
N. Draper & H. Smith, "Applied Regression Analysis," 3rd ed., N.p.: John Wiley & Sons, Inc (1998).
D. Axelson, et al., "H Magnetic Resonance Imaging of Rigid Polymeric Solids," Solid State Nucl. Magn. Reson. 6(4): 309-321, Jul. 1996.
S. Gravina & D. Cory, "Sensitivity and Resolution of Constant-Time Imaging," J. Magn. Reson. B 104(1): 53-61, May 1994.
F. Balezeau, et al., "Mapping of Low Flip Angles in Magnetic Resonance," Phys. Med. Biol. 56(20): 6635-6647, Oct. 2011.
U.S. EPA, "Guidance on Choosing a Sample Design for Environmental Data Collection for use in Developing a Quality Assurance Project Plan," Office of Environmental Information, Washington, DC 20460, Dec. 2002.

* cited by examiner

METHODS OF RADIO FREQUENCY MAGNETIC FIELD MAPPING

CROSS-REFERENCE TO RELATED APPLICATIONS

This application claims the benefit of U.S. Provisional Application Ser. No. 61/597,482 entitled METHODS OF RADIO FREQUENCY MAPPING, filed Feb. 10, 2012.

BACKGROUND

Magnetic resonance imaging ("MRI") is commonly employed for clinical diagnostic imaging. Recent developments in quantitative MRI of reservoir rock core plugs have led to the development of new core analysis methods for capillary pressure and other petro-physical parameters [1-4]. An essential element in quantitative MRI of such systems is a reliable measure of fluid quantity in the pore space. Quantitative imaging is impaired in many cases by non-uniform radio frequency (RF) magnetic fields (typically referred to as "$B_1$ fields") in the sample space of MRI.

In MRI, it is frequently observed that naturally uniform samples do not have uniform image intensities. In many cases this non-uniform image intensity is due to an inhomogeneous $B_1$ field. According to the 'principle of reciprocity' [5,6], the received MR signal for each point in space is proportional to the local $B_1$ field strength per unit excitation current. The spatial variation of the RF field sensitivity for excitation and reception is one principal reason for non-uniform images of nominally uniform samples. Non-uniformities across the MRI image will affect the image-based quantification and interpretation of porous media.

One may solve the $B_1$ inhomogeneity problem by limiting the sample space in a larger RF probe [7] but this is not a very good employment of the experimental sample space that is costly and at a premium. Prior art methods exist for determining the $B_1$ field. When the information is determined or presented in the form of a two dimensional (2D) or three dimensional (3D) spatial distribution, it is called a B1 map. In quantitative MRI, one solution is to measure an absolute $B_1$ map and correct the intensity inhomogeneities that arise from $B_1$ variation [8-15].

Mapping of the $B_1$ field can be undertaken with a wide variety of MRI-based methods. With double angle techniques [14, 16-17], $B_1$ maps are acquired by measurement of the magnitude of the signal after α or 2α excitations. The imaging technique is usually based on spin echo imaging or echo planar imaging. One method is based on acquisition of a spin echo and a stimulated echo and the local $B_1$ is determined by the ratio of images [18]. Actual flip angle imaging (AFI), employs FLASH imaging [19] with the interleaved acquisition of two echoes, applying the same flip angle but for different repetition times [20, 21]. The phase sensitive method for $B_1$ mapping employs a series of RF pulses that generate a transverse magnetization whose phase is a function of the flip angle [22]. If a method is based on gradient echo imaging with large excitation angles, signal intensity variations are produced by employing flip angles that are distributed around 180° [23]. $B_1$ mapping employing the Bloch-Siegert shift idea [24, 25] is one of the latest $B_1$ mapping methods, mostly employed in clinical diagnostic imaging.

$B_1$ mapping methods that are based on frequency encoding, such as all of the above methods, may suffer from $B_0$ inhomogeneity artifacts.

Many methods have been developed to correct non-uniform MRI images due to $B_1$ inhomogeneity [8-15, 29-33]. These image intensity correction methods either focus on the true image or the sensitivity profile because a natural assumption is that the final image is the true image multiplied by a sensitivity function of the system [11].

SUMMARY

In one aspect, the present disclosure relates to a method for measuring $B_1$ for an MRI sample space comprising (a) providing a uniform object in the sample space; (b) generating an excitation pulse, the excitation pulse comprising a low flip angle and an RF pulse duration; (c) acquiring a signal from the excitation pulse wherein the signal is spatially encoded with a phase encode gradient; (d) measuring the intensity of the acquired signal; (e) repeating steps (b) to (d) while varying the phase encode gradient to obtain a phase encoded data set; (f) applying a Fourier transform to the phase encoded data set to generate an MRI image for the specific pulse duration; (g) varying the RF pulse duration and repeating steps (b) to (f); (h) calculating at least two ratios of the signal intensity to at least two different RF pulse durations; and (i) calculating a first slope using at least two of the ratios calculated in step (h), wherein the slope is dependent on $B_1^2$ for a first location in the object. The method may further comprise repeating the above steps while varying the pulse durations and phase encode gradients and calculating a second slope for a second location in the object. The method of may further comprise generating a relative $B_1$ map using the ratio of the first slope to the second slope. The method may further comprise calculating additional slopes for additional locations in the object by repeating the above steps and generating a relative $B_1$ map using ratios between the first, second and additional slopes. The method may further comprise providing an absolute value for $B_1$ for either the first or second location in the object and generating an absolute $B_1$ map. The method may further comprise plotting the first and second slopes and, deriving the RF pulse shape data from the intercept of the plots of the first and second slopes with an axis representing the signal magnitude.

In another aspect, the present disclosure relates to a method of correcting an MRI image of a non-uniform object comprising providing signal magnitude to position values for the image; providing $B_1^2$ values for a plurality of locations in the object obtained using the method comprising the steps of (a) providing a uniform object in the sample space; (b) generating an excitation pulse, the excitation pulse comprising a low flip angle and an RF pulse duration; (c) acquiring a signal from the excitation pulse wherein the signal is spatially encoded with a phase encode gradient; (d) measuring the intensity of the acquired signal; (e) repeating steps (b) to (d) while varying the phase encode gradient to obtain a phase encoded data set; (f) applying a Fourier transform to the phase encoded data set to generate an MRI image for the specific pulse duration; (g) varying the RF pulse duration and repeating steps (b) to (f); (h) calculating at least two ratios of the signal intensity to at least two different RF pulse durations; and (i) calculating a first slope using at least two of the ratios calculated in step (h), wherein the slope is dependent on $B_1^2$ for a first location in the object; dividing the signal magnitude to position values by the $B_1^2$ values; and, obtaining corrected signal magnitude to position values from the division operation, wherein the signals are spatially encoded using a phase encoding selected from the group consisting of centric scan SPRITE, SPRITE and SPI. The non-uniform object may be a reservoir rock sample or other non-uniform sample.

In another aspect, the present disclosure relates to a method of correcting signal intensity non-uniformities in an MRI image comprising providing a B1 values measured according to claim 1; and correcting the non-uniformities using the B1 values.

In another aspect, the present disclosure relates to a method of modeling the effect of pulse length errors in a MR measurement comprising generating an absolute $B_1$ map according to the method of claim 5; and modeling the effect of pulse length errors using the absolute $B_1$ map. The absolute $B_1$ map may be in 3 dimensions.

BRIEF DESCRIPTION OF THE DRAWINGS

FIG. 1 (b) shows linear plots of signal magnitude (a.u.) versus pulse duration (μs) for eight pulses at three different positions along the long axis (Z) of the RF probe (●) 28.5 mm, (○) 61.5 mm, (▼) 100.5 mm;

FIG. 1 (c) shows an absolute 1D $B_1$ map, $B_1$ for an 8 rung birdcage coil;

FIG. 1 (d) shows the 1D axial profile of FIG. 1 (a) after profile correction;

FIG. 2 (b) shows linear plots of signal magnitude versus pulse duration for eight pulses at three different positions along the long axis (Y) of RF probe (●) 34.5 mm, (○) 76.5 mm, (▼) 106.5 mm;

FIG. 2 (c) shows an absolute $B_1$ map centred in a solenoidal RF probe;

FIG. 2 (d) shows the 1D axial profile, after correction, for FIG. 2 (a);

FIG. 4 (b) shows linear plots of signal magnitude versus pulse duration plots for two pixels chosen from the epoxy region;

FIG. 4 (c) shows linear plots of signal magnitude versus pulse duration plots for two pixels chosen from the G10 fiberglass region. The $\kappa\gamma B_1^2$ map for the birdcage pressure vessel coil in the (a) absence and (b) presence of a sample in the sample space;

DETAILED DESCRIPTION

Figure 1A:
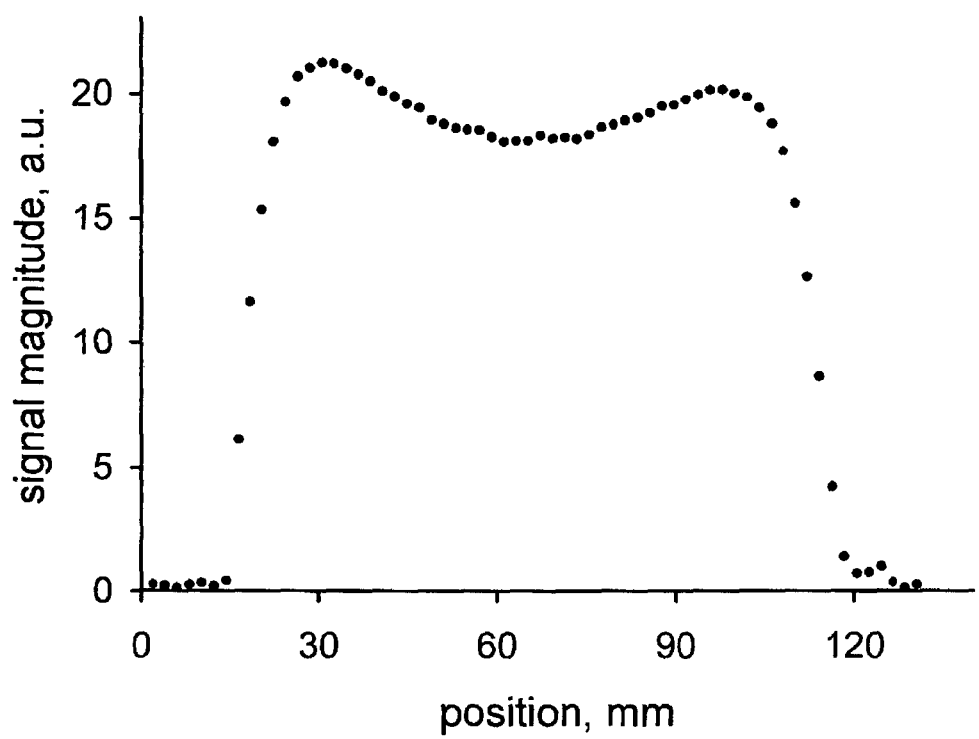
FIG. 1 (a) shows a 1D axial profile for a vial of uniform doped gel scanned at 2.4 T with a birdcage probe.

The current application describes a method for determining or calculating $B_1$ maps from acquired MRI data of a suitable kind.

In certain embodiments of the invention, methods for mapping $B_1$ inhomogeneities are based on measurement of a $B_1$ field employing centric-scan pure phase encode MRI measurements. The resultant $B_1$ map may be employed to correct non-uniformities in MR images.

In certain embodiments of the invention, methods are based on acquiring successive images with low flip angle excitation pulses that are systematically incremented. The local image intensity variation is proportional to $B_1^2$ which ensures high sensitivity to $B_1$ field variations. Pure phase encoding ensures the resultant $B_1$ field maps are free from distortions caused by susceptibility variation, chemical shift and paramagnetic impurities.

In certain embodiments of the invention, quantitative density images result when a centric scan pure phase encode measurement is corrected with a $B_1$ field map.

In certain embodiments $B_1$ mapping methods according to the invention are based on measurements of signal intensities acquired with a series of low flip angle excitation pulses employing centric scan SPRITE [26-28]. Centric scan SPRITE MRI is employed for spin-density measurements of rocks, due to its innate reliability and immunity to image distortions caused by susceptibility variation, chemical shift and paramagnetic impurities. The SPRITE signal in each pixel (or voxel) is proportional to $B_1^2$ due to $B_1$ sensitivity in excitation and reception. The $B_1^2$ sensitivity with a low flip angle excitation makes the method sensitive to $B_1$ variation in the sample space.

In certain embodiments, methods according to the invention are pure phase encode methods, wherein $B_1$ mapping will work in the presence of conductive structures, such as a birdcage style probe structure employing a probe body, itself and a sample in the sample space.

In certain embodiments, a direct post-processing method for correcting $B_1$ inhomogeneity artifacts involves dividing an original image by relative maps of $B_1^2$. Such methods permit correction of non-uniformities due to excitation and reception and the intensity of the corrected image represents the sample distribution.

If one knows the adverse effects of $B_1$ inhomogeneity on the homogeneity of the magnetization for commonly employed MRI single pulse or multi pulse experiments, the signal intensity non-uniformities from those experiments can be corrected by the knowledge of absolute $B_1$ maps.

In certain embodiments, $B_1$ mapping methods according to the invention may be translated to both high field and low field systems.

$B_1$ Mapping Methods According to Certain Embodiments of the Invention

The transverse magnetization $M_{xy}$ generated by a centric scan SPRITE imaging sequence, free from $T_1$ weighting, is given by Eq. 1:

$$M_{xy} = M_0 e^{-t_p/T_2^*} \sin\alpha \qquad (1)$$

where $M_0$ is the equilibrium longitudinal magnetization proportional to quantity of material, $t_p$ is the phase encoding time between RF excitation and signal reception and sin α is the sine of the RF pulse flip angle. If the sequence parameters satisfy $t_p \ll T_2^*$ the absolute transverse magnetization is directly proportional to $M_0$.

The received signal $S_{local}$ from processing nuclei in a small volume $\delta V_s$ [5,6] centered at any point r in the RF probe is given by:

$$S_{local} = B_{1xy}(r) M_{xy}(r) \delta V_s(r) \qquad (2)$$

where $B_{1xy}$ is the component of the RF field produced in the transverse plane at the location of the sample by unit current in the coil, during excitation.

The RF flip angle in Eq. 1 is given by product of the gyromagnetic ratio γ, the $B_1$ field strength, and the duration of the excitation pulse $t_{pulse}$.

The local image intensity from Eqs. 1 and 2 with the above statement of the RF flip angle becomes:

$$S_{local} \propto B_1 M_0 \gamma \sin(\gamma B_1 t) \quad (3)$$

In Eq. 3 the factor $B_1$ is related to signal reception through the 'principle of reciprocity' [5] the sin factor of $B_1$ is related to excitation and the absolute signal is required which is related to $M_0$.

In certain embodiments, a method for $B_1$ mapping according to the invention is based on mapping the signal intensity variations for individual pixels that result from increment of the excitation flip angle in successive images. In the case of low flip angles $\sin\alpha \approx \alpha$ and Eq. 3 reduces to Eq. 4 with a direct dependence of signal on $B_1^2$. This makes the method very sensitive to local $B_1$ field variation.

$$S_{local} \propto B_1^2 M_0 \gamma t_{pulse} \quad (4)$$

Eq. 5 below is a simple modification of Eq. 4. A constant of proportionality κ is introduced to make relationship of Eq. 4 an equality, incorporating $M_0$. Practical measurement of the local $B_1$ proceeds Eq. 5 by incrementing $t_{pulse}$ in successive images, maintaining the low flip angle limit. Plotting local signal versus the $t_{pulse}$ permits determination of $B_1^2$ via the slope.

$$S_{local} = \kappa \gamma B_1^2 t_{pulse} \quad (5)$$

Eqs. 1-5 assume a SPRITE image acquisition with minimal or no $T_2^*$ contrast, a phase encode time $t_p$ which is much less than $T_2^*$. Otherwise, a contrast term $$) \exp\left(-\frac{t_p}{T_2^*}\right)$$

would appear in Eqs 1-5 as it does in Eq. 6 below.

Relative $B_1$ Map Generation Employing a Homogeneous Phantom

For a $B_1$ mapping experiment performed with a homogeneous phantom, $$) \exp\left(-\frac{t_p}{T_2^*}\right)$$

in Eq. 5 can be considered constant: the proton density is written explicitly here whereas above, it is incorporated into κ as $M_0$. The ratio of slopes, M and m' from Eq. 5, measured at two different physical locations (x, y, z) and (x', y', z') will be simply equal to the ratio of $B_1^2$.

$$\frac{m}{m'} = \frac{\left(\kappa \rho_0 \exp\left(-\frac{t_p}{T_2^*}\right)\right) \gamma B_1^2(x, y, z)}{\left(\kappa \rho_0 \exp\left(-\frac{t_p}{T_2^*}\right)\right) \gamma B_1^2(x', y', z')} = \frac{B_1^2(x, y, z)}{B_1^2(x', y', z')} \quad (6)$$

Consequently one can determine relative $B_1$ maps by determination of relative slopes:

$$\frac{m_{local}}{m_{max}} = \left(\frac{B_{1\,local}}{B_{1\,max}}\right)^2 \quad (7)$$

where $m_{max}$ is the highest slope in the measurement where the local $B_1$ field has the maximum value, $B_{1\,max}$.

Absolute $B_1$ Maps According to Certain Embodiments of the Invention Employing a Reference Sample The value of slope ($\kappa \gamma B_1^2$) in Eq. 5 is unit-less and will produce relative $B_1^2$ maps. To display the absolute $B_1$ map in Gauss requires value of κ to be determined. It is helpful to first consider a simple procedure for calibrating the RF field at the centre of the RF probe. The pulse duration for a 180° ($P_{180}$) flip angle for a small reference sample centred in the RF probe should be measured. Knowledge of $P_{180}$ permits the $B_1$ in the centre of the probe to be determined and the constant of proportionality κ can be calculated for the central pixel or voxel. If one assumes the value for κ is the same for all the pixels, the $B_1$ field strength in the middle of the RF probe can be applied as the nominal $B_1$ and the field for other pixels can be calculated easily.

Image Correction Employing $B_1^2$ Maps According to Certain Embodiments of the Invention for SPRITE Images One can correct spatial non-uniformity in one, two and three dimensional images by determining relative $B_1^2$ maps. The correction of the MR image is achieved by dividing the original SPRITE image by a relative $B_1^2$ map. By applying this method, the non-uniformity of the $B_1$ field in excitation and reception can be compensated and the intensity of the corrected image represents the sample distribution.

Experiments $B_1$ Mapping in the Sample Space of the RF Coils at 2.4 T and 0.2 T MRI experiments using one or more methods, according to certain embodiments of the invention were performed on high and low field scanners. The high field scanner was a Tecmag (Houston, Tex.) Apollo console equipped with a Nalorac (Martinez, Calif.) 2.4 T 32 cm i.d. horizontal bore superconducting magnet with a homebuilt 8-rung birdcage coil 4 cm in diameter and 10 cm in length. A water-cooled 76-mm i.d. gradient set driven by Techron (Elkhart, Ind.) 8710 amplifiers provided a gradient strength up to 100 G/cm. The low field scanner was a Maran DRX-HF (Oxford Instruments Ltd, Oxford, UK) 0.2 T magnet with a vertical RF coil 10 cm in diameter and 10 cm in length. A shielded three axis gradient coils driven by x, y, z gradients Techron (Elkhart, Ind.) 7782 gradient amplifiers, provided for maximum of 26 G/cm, 24 G/cm and 33 G/cm.

The Aciss, Unison and Unifit processing packages developed in the IDL programming environment (Boulder, Colo.) by the UNB MRI Centre were employed for image reconstruction, display and signal intensity mapping.

A vial of uniform gel doped with $CuSO_4$, 10 cm in length and 4 cm in diameter, centred in the RF coil was employed as a test object on the 2.4 T scanner. The bulk relaxation times were $T_2^*=4.5$ ms, $T_1=15$ ms. A set of 1D SPRITE images was acquired for 1D $B_1$ mapping. dhk SPRITE imaging sequence parameters were: FOV=130 mm; SW=250000 Hz; 64 k-space points were acquired with a phase encoding time of $t_p=100$ μs with TR=2 ms, DW=2 μs, NS=32, $P_{90}=42$ μs with 50% RF power. The dhk SPRITE pulse duration was set to 8 different values (1.4 μs, 1.8 μs, 2.2 μs, 2.6 μs, 3 μs, 3.3 μs, 3.6 μs and 4 μs). The shortest and longest pulse durations are equivalent to 2.4° and 8° flip angles. The phase cycle for SPRITE RF pulses was $XX\bar{Y}\bar{Y}$ while for the receiver phase it was $\bar{X}\bar{X}YY$. The acquisition time for each image was approximately 52 s.

The same sample was employed for 3D $B_1$ mapping. Conical SPRITE imaging sequence parameters were: FOV=130 mm; SW=250000 Hz; 64 k-space points were acquired with a phase encoding time of 200 µs, DW=2 µs, NS=8. Eight 3D images were acquired with the same RF excitation pulse durations as outlined for 1D measurement. The acquisition time for each 3D image was approximately 16 minutes.

A vial of water doped with $CuSO_4$, 10 cm in length and 4 cm in diameter, was employed as a test object for scanning at 0.2 T. The bulk relaxation times were $T_2^*$=2 ms, $T_1$=40 ms. A set of 1D SPRITE images were acquired for 1D $B_1$ mapping. Double-half k-space (dhk) SPRITE imaging parameters were: FOV=125 mm; SW=125000 Hz; 64 k-space points were acquired with a phase encoding time of 100 µs with TR=2 ms, DW=8 µs, NS=256, $P_{90}$=63 µs with 50% RF power. The dhk SPRITE pulse durations were (1.5 µs, 2 µs, 2.6 µs, 3 µs, 3.5 µs, 4 µs, 4.5 µs and 5 µs). The shortest and longest pulse durations are equivalent to 2.1° and 7.1° flip angles. The acquisition time for each image was approximately 51 s.

$B_1$ Mapping in the Vicinity of an 8-Rung Birdcage Resonator Placed Inside a High Pressure Vessel $B_1$ mapping measurements using one or more methods according to one or more embodiments of the invention were also undertaken in and around the sample space of a new style MRI compatible pressure vessel [35]. These pressure vessels have the RF probe located inside the high tensile strength non-magnetic stainless steel shell of the pressure vessel. The stainless steel case acts as the RF shield for the probe. An eight rung birdcage RF probe was embedded in a fiberglass/epoxy probe body within the pressure vessel. The fiberglass and epoxy materials have short but finite $T_2^*$ and produce detectable MR signal with the SPRITE MRI method. These signals outside the sample space and in the vicinity of the RF probe may be employed to map the local $B_1$ field.

The cylindrical pressure vessel had an outside diameter of 7.6 cm, an inside diameter of 5.1 cm and a length of 30.5 cm. The birdcage RF probe embedded in epoxy and G10 fiberglass had: copper struts 7.5 cm in length and 6.4 mm in width. The G10 fiberglass and epoxy was 9.5 mm thick. The epoxy, West system epoxy (Bay City, Mich.) is in immediate proximity to the birdcage struts. The empty vessel at 50° C. has background signal from epoxy and fibreglass with $T_2^*$ lifetimes of 5.5 µs (69%), 34 µs (20%) and 108 µs (11%).

To generate a $B_1$ map for the RF probe structure Spiral-SPRITE imaging was employed. Spiral-SPRITE imaging sequence parameters were: FOV=50 mm*50 mm; SW=500000 Hz; with a phase encoding time of $t_p$=45 µs with TR=2 ms, DW=1 µs, NS=32. P90 was 163 µs for 22% RF power. The Spiral-SPRITE pulse durations were 3 µs, 3.25 µs, 3.5 µs, 3.75 µs, 4 µs and 4.25 µs. The shortest and longest pulse durations are equivalent to 1.6° and 2.3° flip angles. The acquisition time for each image was approximately 11 min.

Results

1D $B_1$ Mapping at 2.4 T

FIG. 1(a) shows a 1D axial profile for a vial of uniform doped gel 10 cm in length and 4 cm in diameter scanned at 2.4 T. The profile is very non-uniform for a nominally uniform phantom. Note the signal magnitude at profile edges is enhanced by approximately 23%. The signal non-uniformities arise from $B_1$ field inhomogeneity.

Figure 1B:
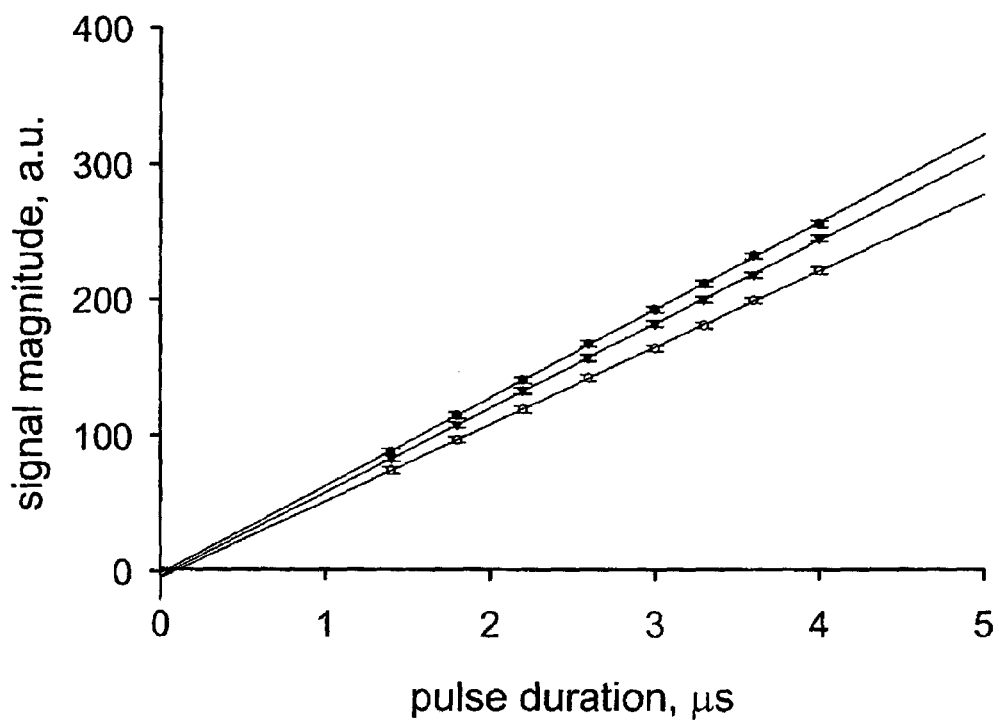

FIG. 1(b) shows plots of signal versus pulse duration for three different positions in the long axis of the RF probe (Z=28.5 mm, 61.5 mm, 100.5 mm). Eight pulse durations were employed giving flip angles from 3° to 8.5°. The slopes yield $\gamma \kappa B_1^2$ for each pixel according to Eq. 5. The uncertainty for each data point is estimated from the mean background noise in a profile. The noise is assumed to be constant for all the images obtained with the same number of scans. The uncertainty for each individual point in FIG. 1(b) is approximately ±0.5%. The pixels that are close to the edge of the profile have greater slopes, in comparison to central pixels, due to a higher local $B_1$ field.

FIG. 1(c) shows an absolute 1D $B_1$ map for the 8-rung birdcage coil at 2.4 T. The $B_1$ value for each pixel was determined from $\kappa \gamma B_1^2$ where $\kappa$ was determined independently by measurement of 180° pulse for a small sample. With eight 1D profiles of above sample, and 32 signal averages for each profile, the $B_1$ uncertainty was approximately 0.35%.

The corrected profile was produced by division of the distorted profile in FIG. 1(a) by $\kappa \gamma B_1^2$ map. FIG. 1(d) shows the 1D axial profile after profile correction of FIG. 1(a).

1D $B_1$ Mapping at 0.2 T

Figure 2A:
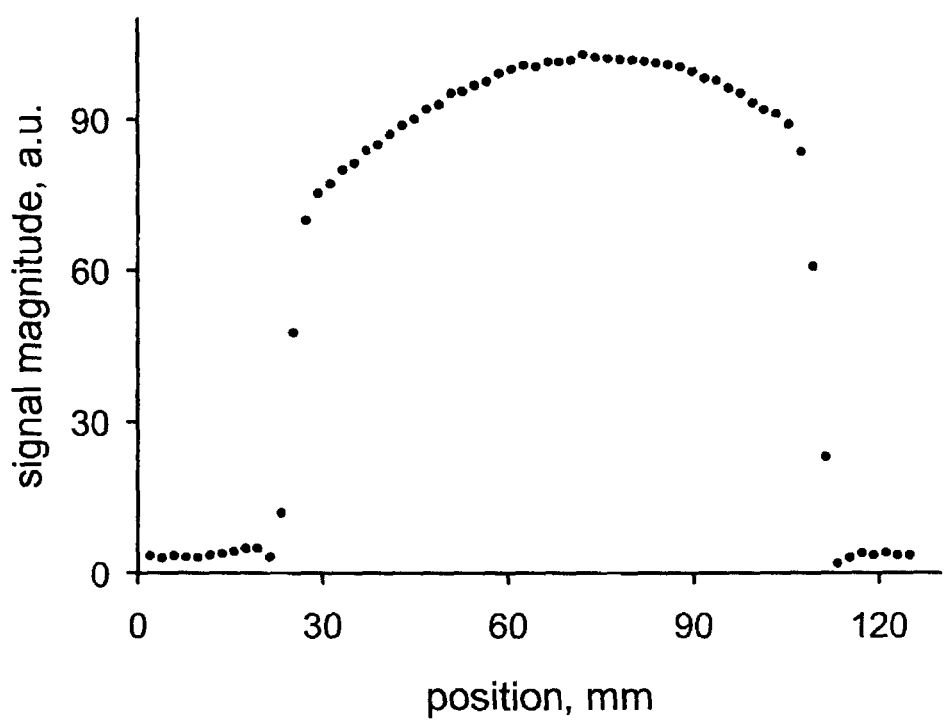
FIG. 2 (a) shows a 1D axial profile of a vial of doped water scanned at 0.2 T with a solenoidal probe.

FIG. 2(a) show the 1D axial profile of a vial of doped water, 10 cm in length and 4 cm in diameter. The profiles were produced, employing dhk SPRITE at 0.2 T. In contrast to FIG. 1(a) the profile shows a 35% signal decrement near the edge of the profile. This is due to higher $B_1$ field in the centre of the solenoidal RF coil.

Figure 2B:
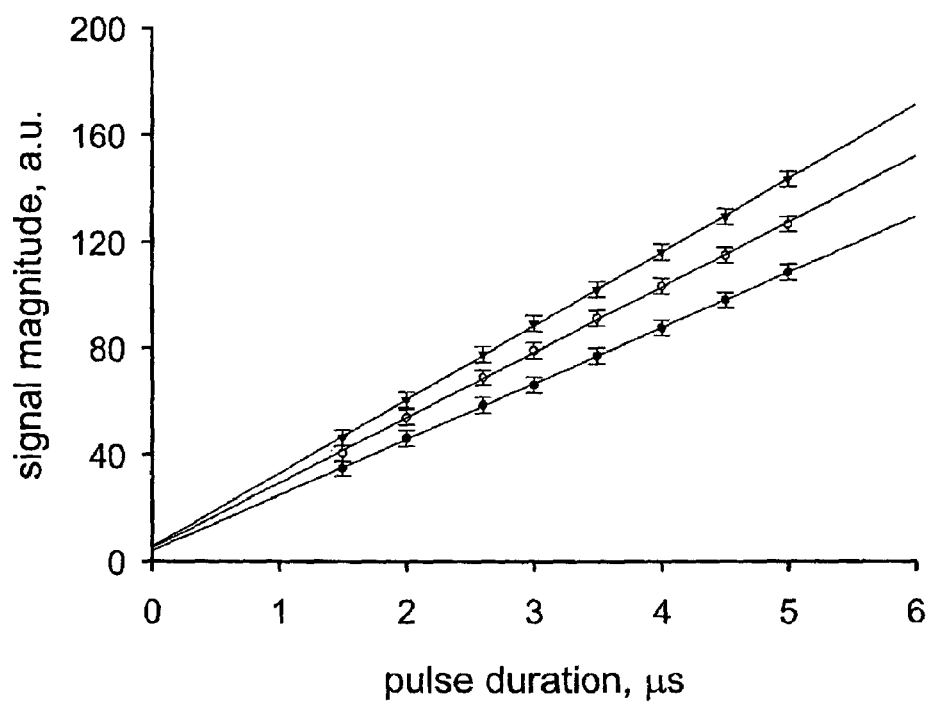

FIG. 2(b) shows plots of signal variation versus pulse duration for three different positions along the long axis of the probe (Y=34.5 mm, 76.5 mm, 106.5 mm). Eight pulse durations were employed giving flip angles from 2.1° to 7.1°. There is an uncertainty of ±1.5% for each individual data point. Once more the noise is estimated based on background noise in the profile.

Figure 2C:
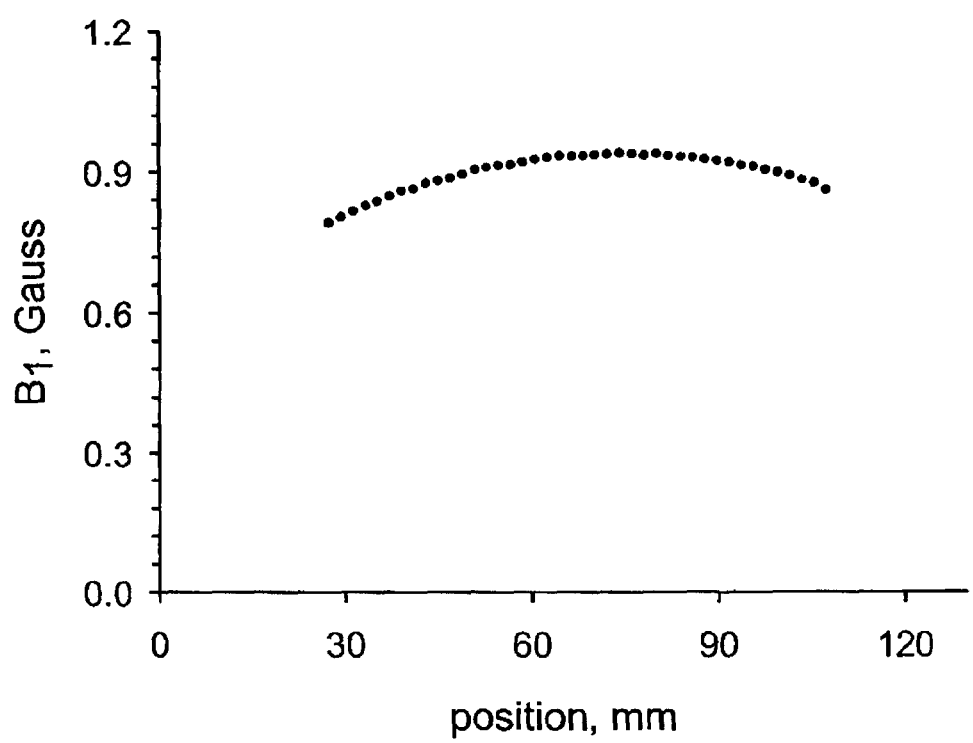
Figure 2D:
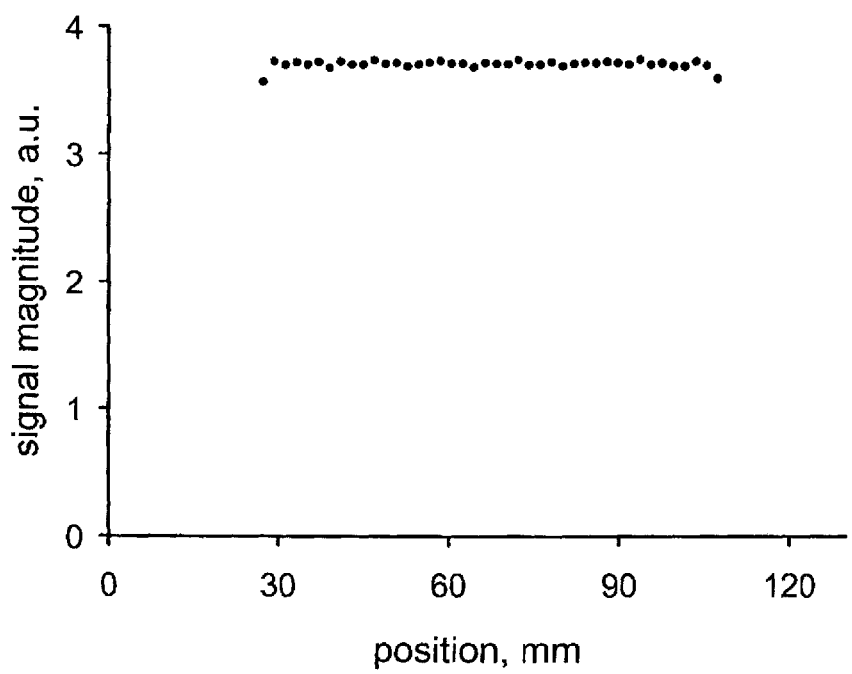

FIGS. 2(c) and 2(d) show $B_1$ maps for the above sample centred in a solenoidal RF probe and the profile correction for the profile of FIG. 2(a), were produced same as section 4.1.

3D $B_1$ Mapping at 2.4 T

Figure 3:
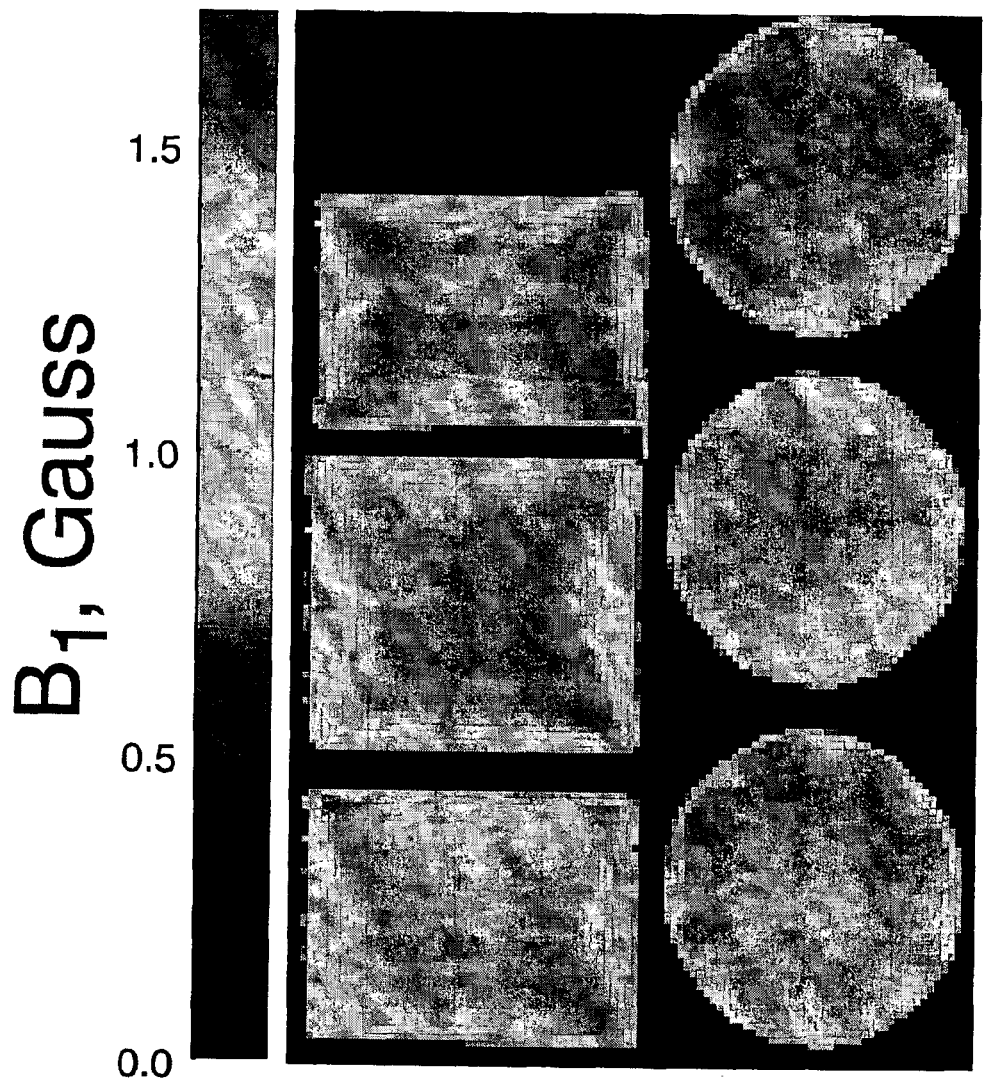
FIG. 3 shows the coronal and sagittal images of the $B_1$ field distribution from 3D $B_1$ maps for the eight rung birdcage coil at 2.4 T. For each orientation three different planes, one in the centre and two close to the edges, are shown.

FIG. 3 shows coronal and sagittal 2D planes yielded from 3D $B_1$ maps for the 8-rung birdcage coil employed at 2.4 T. For each orientation three different planes, one in the centre and two close to the edges are shown. The maximum $B_1$ value is 1.7 Gauss while the minimum $B_1$ value is 0.5 Gauss. Coronal 2D images show signal increment in proximity of the birdcage coil struts. Signal enhancement is because of the strong $B_1$ field near the edges of the image that is a typical result for a birdcage probe [36-45]. The $B_1$ distribution in the central part of the sample is noticeably more uniform than the parts near the sample edges that are closer to the birdcage struts.

2D $B_1$ Mapping in the Vicinity of an 8-Rung Birdcage Resonator Inside a High Pressure Vessel The signal contribution from epoxy and G10 fiberglass in the pressure vessel probe body are not equivalent. The sample magnetization $M_0$ and signal lifetime $T_2^*$ differ for two materials, Eq. 1. The local $B_1$ field will also be different due to segregation of two materials with the epoxy closer to the struts than the fibreglass. Nevertheless, it is possible to map the local $B_1$ through changing the excitation pulse length as previously described.

Figure 4A:
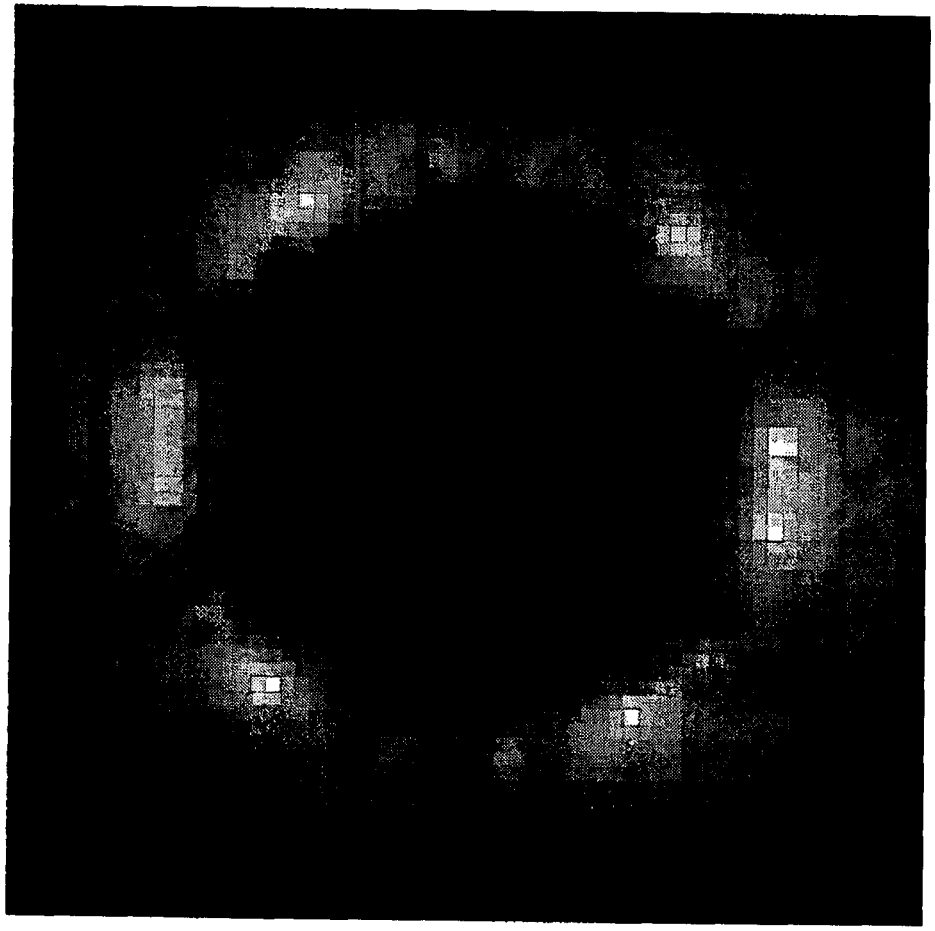
FIG. 4 (a) shows a 2D image of an empty pressure vessel probe. Background MR signal arises from the polymer material employed in building the probe. The maximum signal is for West system epoxy embedding the birdcage struts. The remaining signal arises from G10 fiberglass.

FIG. 4(a) shows a 2D image of the empty pressure vessel probe [28]. Background MR signal arises from the polymer materials employed in building the probe. The maximum signal is for epoxy embedding the birdcage struts. The remaining signal arises from G10 fiberglass. The number of scans and encoding time ($t_p$) were carefully adjusted to observe the signal from both, short pulse duration, and short $T_2^*$ components.

Figure 4B:
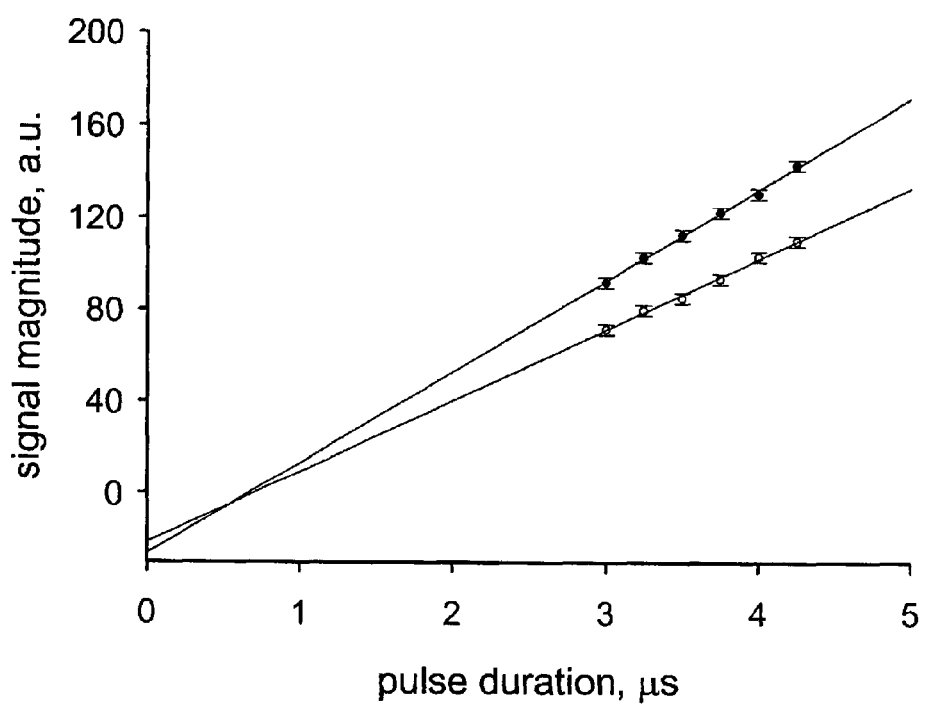
Figure 4C:
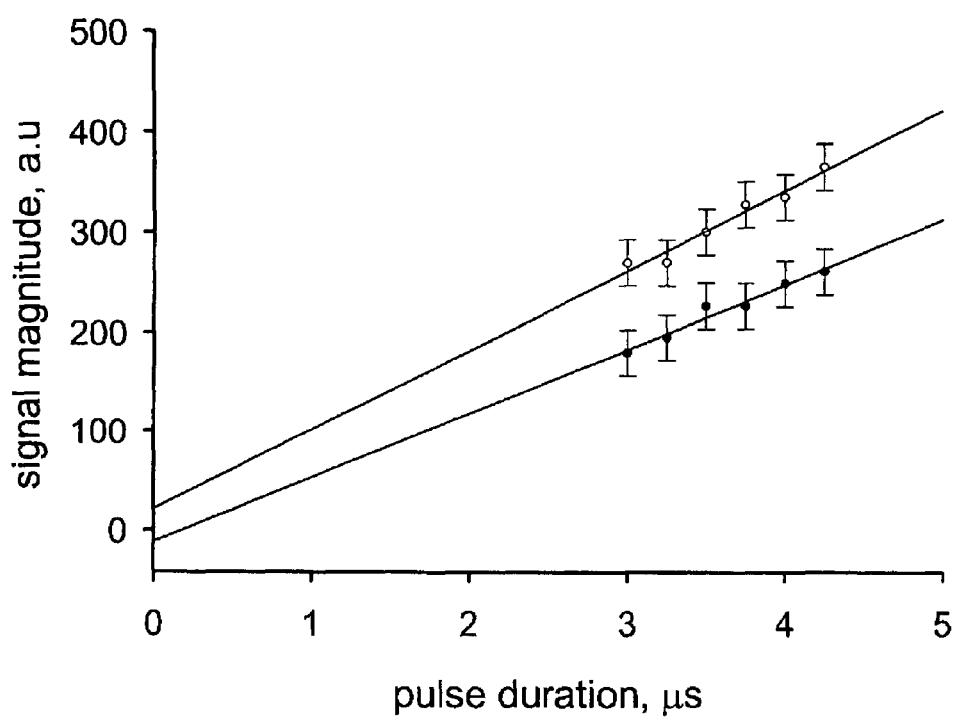

FIGS. 4(b) and 4(c) show signal intensity versus pulse duration plots for 4 different pixels. Two pixels are from the epoxy region, 4(*b*) and two pixels are from the G10 fiberglass region, 4(*c*). The slopes for each pixel yield $\kappa\gamma B_1^2$ and absolute $B_1$ maps outside of the sample space. Note the $B_1$ strength is much higher in the vicinity of the struts where high intensity signal appears in FIG. 4(*a*). The flip angles employed to yield the signal map must be selected in a narrow range to be sure that the low flip angle limit is satisfied.

Figure 5A:
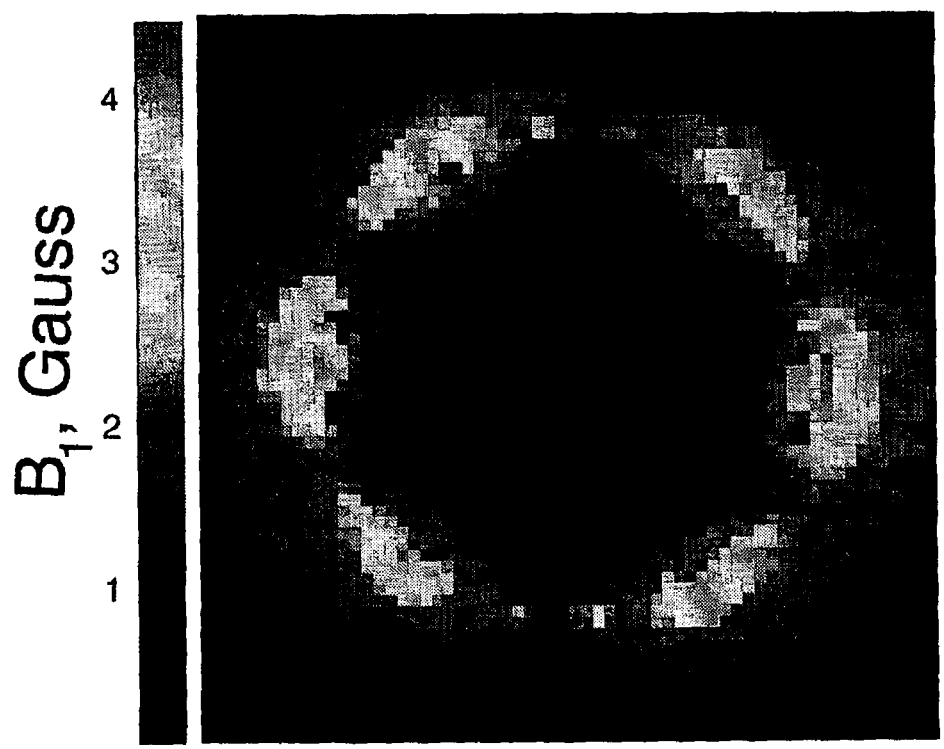
FIG. 5. shows $\kappa\gamma B_1^2$ maps for a pressure vessel in the (a) absence and (b) presence of a sample in the sample space FIG. 6. shows an absolute $B_1$ map outside of the sample space for the RF probe in a pressure vessel.
Figure 5B:
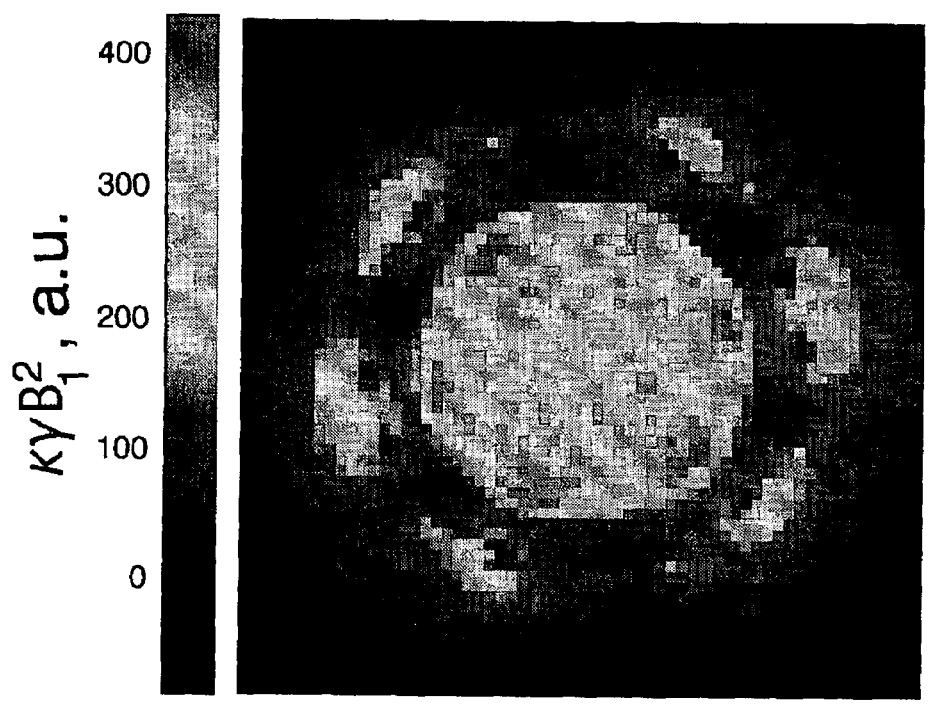

FIGS. 5(*a*) and 5(*b*) show $\kappa\gamma B_1^2$ maps for the birdcage pressure vessel coil in the absence and presence of a sample in the sample space. The reason for measuring $\kappa\gamma B_1^2$ in the presence of a sample is to calibrate the measure to yield absolute $B_1$ maps in Gauss.

Figure 6:
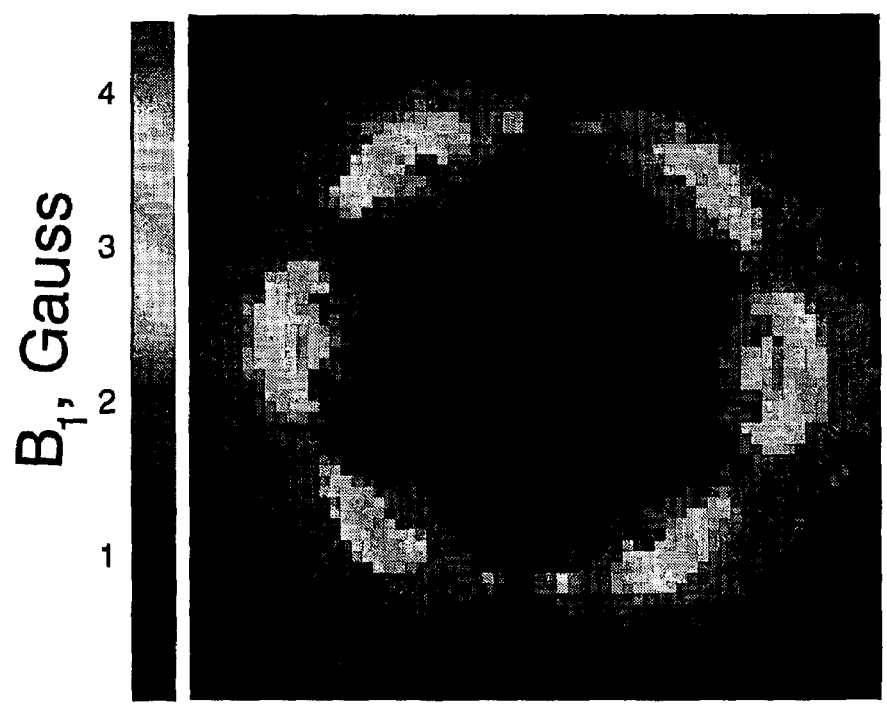

FIG. 6 shows the absolute $B_1$ map outside of the sample space that is calibrated in Gauss. The pressure vessel probe is made of eight rungs, but only six rungs can be identified in $B_1$ map. The first mode (k=1) is the mode of interest for the homogeneous probe design [43]. The high-pass birdcage coil design, for mode k=1, will have a current distribution with two struts having no current. Hence the signal from polymers that are near the struts with no current will be near zero.

Discussion of the Results 1D and 3D $B_1$ Mapping at 2.4 T

Figure 1:
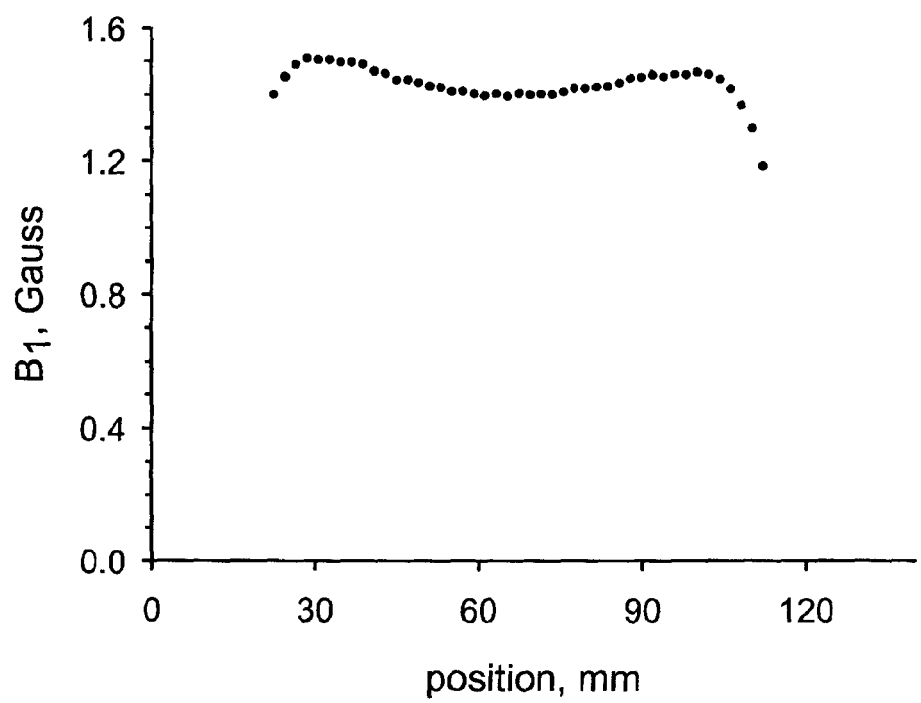
Figure 1D:
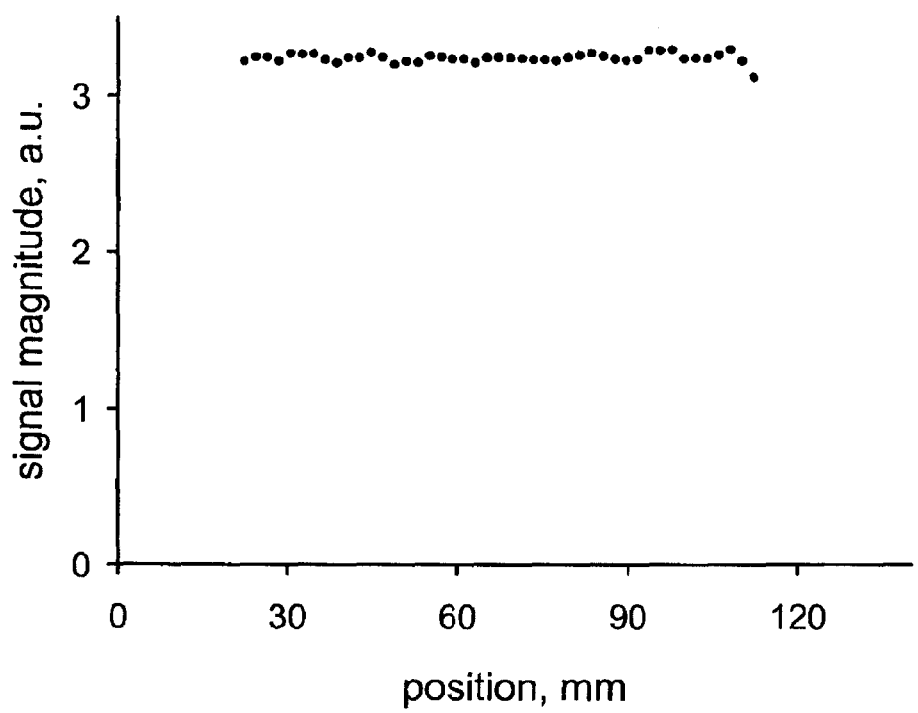

The non-uniformity in 1D axial profile for uniform vial of doped gel in FIG. 1(*a*) is due to the 3D spatial pattern of $B_1$ field. The 3D $B_1$ mapping shows stronger $B_1$ field near the conductors. The coronal 2D images of the above sample in FIG. 3 show the B1 field on the planes near the edges of the birdcage coil is stronger than the central coronal plane. This explains the enhancement of signal in 1D profile edges. Close agreement was yielded between 3D $B_1$ mapping results and calculations or other $B_1$ measurements for a birdcage coil [36-45].

If one is to do 1D $B_1$ mapping and $B_1$ correction, it is necessary in one or more embodiments of the invention to employ a $B_1$ mapping phantom which has the same diameter.

1D $B_1$ Mapping at 0.2 T

The spatial pattern of 1D $B_1$ map at 0.2 T in FIG. 2(*c*) is different from the 1D $B_1$ map at 2.4 T because the employed RF coil was a solenoid. The 1D $B_1$ mapping and profile correction needs to be undertaken with a phantom of same diameter.

The 1D axial profiling is very important at low field MRI. At low field many analysis are based on 10 profile analysis along the natural orientation of the RF probe that is usually the vertical axis. The result in FIG. 2(*a*) shows that the 1D profile is very inhomogeneous in this orientation. Hence, $B_1$ correction is very critical for resultant inhomogeneous 10 profiles.

One important application of 1D axial profiling is quantitative MRI of reservoir rocks. It is possible to correct $B_1$ inhomogeneity employing a reference sample. The idea is to generate 1D profiles of the true sample and the reference sample that are in the same size. The ratio of true image by stationary image eliminates $B_1$ inhomogeneity effects. This method works as long as there are no other differences and is not an ideal approach due to extra measurement for the reference sample. Better is to determine $B_1$ map then correct the image.

Image Correction Problem for the Sample Edges

For dhk centric scan SPRITE sampling the exponential decay of longitudinal magnetization leads to exponential filtering along the primary phase encode direction of k-space. The exponential filtering effect introduces a convolution blurring to the image [28]. The convolution effect will be more considerable for larger flip angles.

$B_1$ maps are limited by phantom length. In certain embodiments it is desirable to ensure the phantom is larger than real samples. In this way, good $B_1$ maps for the sample space are yielded. One should consider when the phantom is large, near the edges of the RF probe the $B_1$ field strength will be decreased. Hence, the signal fall in the edges of FIGS. 1(*a*) and 1(*b*), are generated from large samples, could be due to either $B_1$ field strength fall near the probe edges or convolution blurring effects due to the sample edges.

Selecting an Appropriate Pulse Length Range for $B_1$ Determination According to Certain Embodiments of the Invention In the current experiments, there are sets of data ($t_{pulse}$, S) for each pixel that S stands for signal magnitude. One is interested to fit relationships between $t_{pulse}$ and S for small flip angles to have a linear regression according to Eq. 5. Choice of an appropriate $t_{pulse}$ range is very significant.

The maximum flip angle 8° was the one employed for 1D and 3D $B_1$ mapping experiments related to 4 µs pulse duration with the minimum pulse duration of 1.4 µs that results flip angle of 2.4°. Increment in maximum flip angle for the experiment will increase the error for small angle approximation. Maximum $t_{pulse}$ associated 10° flip angle and minimum $t_{pulse}$ of 1 µs is a reasonable range for $B_1$ mapping experiment. 10° flip angle cause 0.5% error in small flip angle approximation. The minimum flip angle in the experiment is a hardware dependent parameter and is chosen based on a reliable minimum pulse length of 1 µs. The rise time for the RF pulse will affect the RF pulse shape especially when it is comparable with the RF pulse duration.

In a $B_1$ mapping experiment, one can repeat the experiment for each measurement in order to determine uncertainty for each individual pixel. However, in the current experiment it is assumed that noise level in each profile is a good indicator of uncertainty on signal measurement. One can increase NS to improve SNR for each individual point by $\sqrt{NS}$. For a constant NS, the noise level is the same for a range of pulse durations. Change in pulse duration will affect only signal level.

After determination of appropriate pulse duration range, the significant question is whether to pick more numbers of $t_{pulse}$ along the X axis with fewer NS for each individual image or fewer number of $t_{pulse}$ employing more NS (FIGS. 1(*b*), 2(*b*), 4(*b*) and 4(*c*)). It is intuitive that if the number of $t_{pulse}$ on the X axis increases, certainty in $B_1$ maps increases. However, it is also possible with fewer numbers of $t_{pulse}$, but higher quality images for each $t_{pulse}$, certainty increases. The key distinction in sampling design is between judgmental sampling and probability sampling. An efficient sampling design is one that employs all available prior information to satisfy the region and set appropriate probabilities of selection [46].

For an experimenter who has restricted time to perform the experiment and concerned to design a $B_1$ map experiment for an RF probe for the first time, the experiment design will be different. The experimenter should employ a sample design to include both judgmental and probabilistic sampling. In this case, minimum number of points (6 to 10 points) in acceptable interval flip angles (say less than 10°) is suggested that the intervals between each two point is approximately 1° with NS>10.

An experimenter that is an expert in $B_1$ mapping in a typical system and has enough knowledge about the linear range of the experiment for the typical probe, and is sure about the extreme points in which the linear regression is sill adequate, can take 2 points in the extremes with the most number of observations (NS in our experiment). By taking most observations (NS) at the extremes, one will reduce the standard error of the slope estimate [47].

Bias Errors (Errors in Intercepts)

Although there is no intercept in Eq. 5, the presence of positive and negative intercepts is obvious in FIGS. 1(b), 2(b), 4(b) and 4(c).

There are two main sources of systematic bias errors in $B_1$ mapping experiments. The first source of bias error is from $\sigma_{noise}$ (noise magnitude) results from employing image magnitudes in $B_1$ mapping experiments. Image magnitude effect is added to Eq. 5 as a positive intercept.

The rise/fall time of the RF probe could cause additional positive or negative intercept. The RF rise/fall time was measured employing an oscilloscope. The RF rise time for American Microwave Technology RF amplifier employed at 2.4 T and TOMCO amplifier employed at 0.2 T, was 100 n. The RF fall time for both systems was less than the rise time and about 50 ns.

By consideration of above discussion, the Eq. 5 could be rewritten as:

$$S_{local} = \kappa\gamma B_1^2 (t_{pulse}+\tau) + \sigma_{noise} = \kappa\gamma B_1^2 t_{pulse} + \kappa\gamma B_1^2 \tau + \sigma_{noise} \quad [6]$$

$\gamma\kappa B_1^2\tau$ show the bias error in intercept due to rise time of the RF pulse. There is $B_1^2$ dependency in intercept values. This dependency of y intercept to $B_1$ strength can be clearly observed by looking at y-intercept values for each pixel FIGS. 4(b) and 4c in which the intercepts were changed both in magnitude and sign. In conclusion the error in y-intercept for the linear plot associated with each pixel could be due to $\sigma_{noise}$, $\tau$ and $B_1$ strength.

It will be understood that while the invention has been described in conjunction with specific embodiments thereof, the foregoing description and examples are intended to illustrate, but not limit the scope of the invention. Other aspects, advantages and modifications will be apparent to those skilled in the art to which the invention pertains, and these aspects and modifications are within the scope of the invention.

Figure 7:
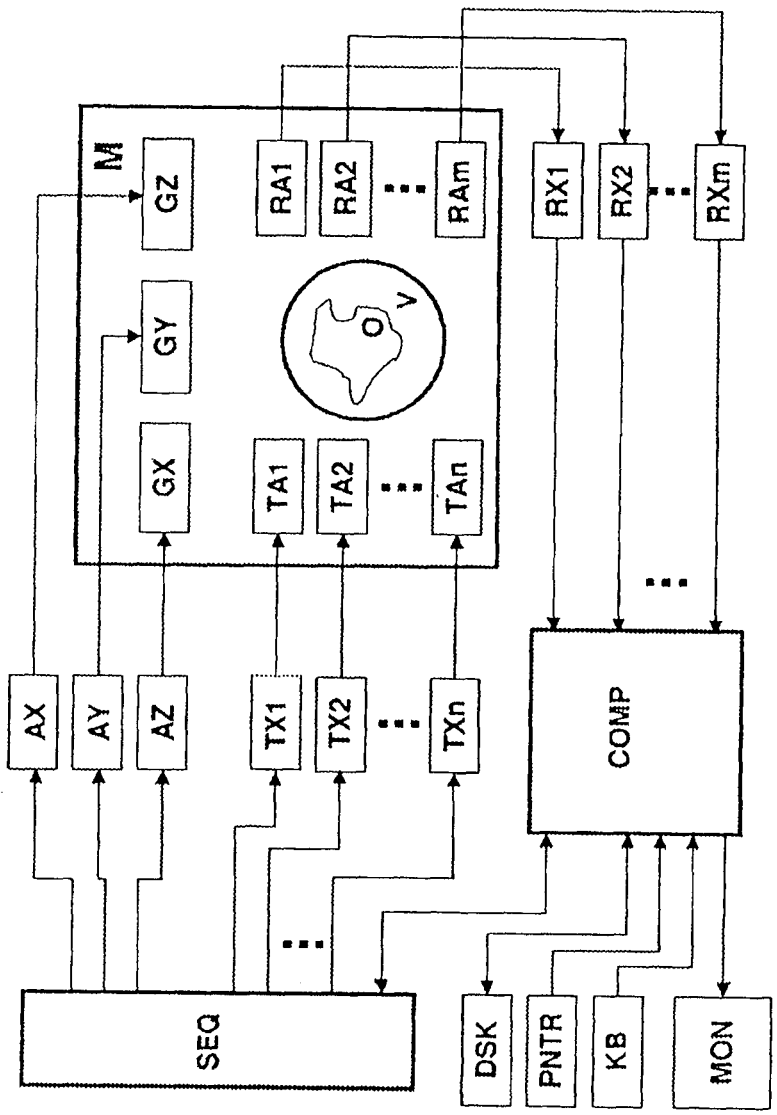
FIG. 7 is a general overall schematic diagram of an MRI system suitable for practicing the present invention.

Methods according to certain embodiments of the present invention are not limited to rock core analysis and may be used to address $B_1$ inhomogeneity encountered when using MRI instruments such as those from Oxford Instruments. For example, FIG. 7 schematically shows an MRI measuring system which is suited for performing the inventive method. The system contains a main magnet M for generating the basic magnetic field which is substantially homogeneous and static in a volume under investigation V. Three sets of gradient coils GX, GY, and GZ are introduced into the bore of the main magnet M, which surround the volume under investigation V, and can superpose additional magnetic fields of controllable duration and strength with constant gradients on the basic field. Gradient amplifiers AX, AY, and AZ, which are driven by a sequence control unit SEQ for timely generation of gradient pulses, provide the gradient coils GX, GY, GZ with electric current for generating substantially linear gradient fields.

Several transmitting elements TA1 to TAn are located in the gradient field system, the entirety of which is also called transmitting antenna means. They surround an object under investigation O and are fed by several independent RF power transmitters TX1 . . . TXn. The RF pulses generated by these RF power transmitters TX1 . . . TXn are determined by the sequence control unit SEQ and triggered at the correct time. The transmitting elements TA1 to TAn irradiate RF pulses onto the object under investigation O located in the volume under investigation (also referred to herein as the sample space) V (as described in more detail in FIG. 7), thereby exciting the nuclear spins. The resulting magnetic resonance signals are converted into electric voltage signals using one or more RF receiver elements RA1, . . . , RAm, which are then supplied to a corresponding number of receiver units RX1, . . . , RXm. The overall receiver elements RA1, . . . , RAm are also called receiver antenna means that consists of m receiver elements RA1, . . . , RAm. These are also located within the gradient coils GX, GY, GZ and surround the object under investigation O. In order to reduce the expense for equipment, the transmitting and receiver antenna means may also be designed and connected in such a fashion that one or more of the transmitting elements TA1 to TAn are also used for receiving the magnetic resonance signals. In this case, which is not considered in FIG. 7, switching over between transmitting and receiving operation is effected by one or more electronic transmitting-receiver switch points that are controlled by the sequence control unit SEQ. This means that during the RF transmitting phases of the executed RF pulse sequence, this antenna(s) is/are connected to the corresponding RF power transmitter(s) and is/are separated from the allocated receiver channels, while for the receiver phases, the transmitters are separated and the receiver channel is connected. The received signals are amplified by the receiving units RX1 to RXm shown in FIG. 7, and are converted into digital signals using conventional signal processing methods, and passed on to an electronic computer system COMP. In addition to the reconstruction of images and spectra and values derived from the received measured data, the controlling computer system COMP serves to operate the entire MRI measuring system and initiates performance of the pulse sequences through corresponding communication with the sequence control unit SEQ. The user-controlled or automatic execution of programs for adjusting the measuring system properties and/or for generating magnetic resonance images is also provided on this control computer system COMP, as well as the display of the reconstructed images, storage and management of measurement and image data and control programs. In order to perform these tasks, this computer system has at least one processor, one working memory, one computer keyboard KB, one display instrument PNTR, e.g. a computer mouse, one screen MON and one external digital storage unit DSK.

It will be understood that while the invention has been described in conjunction with specific embodiments thereof, the foregoing description and examples are intended to illustrate, but not limit the scope of the invention. Other aspects, advantages and modifications will be apparent to those skilled in the art to which the invention pertain, and those aspects and modifications are within the scope of the invention.

$B_1$ inhomogeneity is a limitation which may be encountered when undertaking 1D profiling measurements of vertical samples in permanent magnet MRI instruments and methods according to certain embodiments of the invention may be used to correct for such inhomogeneity.

The embodiments of the methods described herein may be implemented in hardware or software, or a combination of both and said hardware and/or software may be implemented in MRI instruments. These embodiments may be implemented in computer programs executing on programmable computers each comprising at least one processor, a data storage system (including volatile and non-volatile memory and/or storage elements), at least one input device, and at least one output device. Program code is applied to input data to perform the functions described herein and generate output information. The output information is applied to one or more output devices, in known fashion.

Each program may be implemented in a high level procedural or object oriented programming and/or scripting language to communicate with a computer system. However, the programs can be implemented in assembly or machine language, if desired. In any case, the language may be a compiled or interpreted language. Each such computer program may be stored on a storage media or a device (e.g. ROM or magnetic diskette) readable by a general or special purpose programmable computer, for configuring and operating the computer when the storage media or device is read by the computer to perform the procedures described herein.

Furthermore, the system, processes and methods of the described embodiments are capable of being distributed in a computer program product comprising a computer readable medium that bears computer usable instructions for one or more processors. The medium may be provided in various forms, including one or more diskettes, compact disks, tapes, chips, wireline transmissions, satellite transmissions, internet transmission or downloadings, magnetic and electronic storage media, digital and analog signals, and the like. The computer useable instructions may also be in various forms, including compiled and non-compiled code.

REFERENCES

[1] O. V. Petrov, B. J. Balcom, Two-dimensional $T_2$ distribution mapping in porous solids with phase encode MRI, J. Magn. Reson. 212 (2011) 102-108.

[2] O. V. Petrov, G. Ersland, B. J. Balcom, $T_2$ distribution mapping profiles with phase encode MRI, J. Magn. Reson. 209 (2011) 39-46.

[3] Q. Chen, A. E. Marble, L. Romero-Zeron, B. J. Balcom, Flow imaging of fluids in porous media by magnetization prepared centric-scan SPRITE, J. Magn. Reson. 197 (2009) 1-8.

[4] Q. Chen and B. J. Balcom, Measurement of rock core capillary pressure curves using a single-speed centrifuge and one dimensional magnetic resonance imaging, J. Chem. Phys. 122, 214720 (2005) 1-8.

[5] D. I. Hoult, R. E. Richards, The signal-to-noise ratio of the nuclear magnetic resonance experiment, J. Magn, Reson. 24 (1976) 71-85.

[6] D. I. Hoult, The principle of reciprocity in signal strength calculations-a mathematical guide, Concepts. Magn. Reson. 12(4) (2000) 173-187.

[7] D. I. Hoult, The NMR receiver: A description and analysis of design, Progress in NMR Spectroscopy, 12 (1978) 41-77.

[8] H. Mihara, N. Iriguchi, S. Ueno, A method of RF inhomogeneity correction in MR imaging, Magn. Reson. Mater. Phys., Biol. Med. 7 (1998) 115-120.

[9] S. Volz, U. Noth, A, Rotarska-Jagiela, R. Deichmann, A fast $B_1$-mapping method for the correction and normalization of magnetization transfer ratio maps at 3T, Neurolmage, 49 (2010) 3015-3026.

[10] C. D. J. Sinclair, J. M. Morrow, M. G. Hanna, M. M. Reilly, T. A. Yousry, X. Golay, J. S. Thornton, Correcting radiofrequency inhomogeneity effects in skeletal muscle magnetization transfer maps, NMR. Biomed. 25(2) (2012) 262-270.

[11] J. Wang, M. Qiu, Q. X. Yang, M. B. Smith, R. T. Constable, Measurement and correction of transmitter and receiver induced nonuniformities in vivo, Magn. Reson. Med. 53 (2005) 408-417.

[12] E. R. McVeigh, M. J. Bronskill, R. M. Henkelman, Phase and sensitivity of receiver coils in magnetic resonance imaging, Med. Phys. 13 (1986) 806-814.

[13] F. O. Zelaya, W. U. Roffmann, S. Crozier, S. Teed, D. Gross, D. M. Doddrell, Direct visualization of $B_1$ inhomogeneity by flip angle dependency, Magn. Reson. Imaging. 15 (1997) 497-504.

[14] E. K. Insko, I. Bolinger, Mapping of the radiofrequency field, J. Magn. Reson. 103 (1993) 82-85.

[15] R. Treier, A. Steingoetter, M. Fried, W. Schwizer, P. Boesiger, Optimized and combined $T_1$ and $B_1$ mapping technique for fast and accurate $T_1$ quantification in contrast-enhanced abdominal MRI, Mag. Reson. Med. 57 (2007) 568-576.

[16] R. Stollberger, P. Wach, Imaging of the active $B_1$ field in vivo, Magn Reson. Med. 35 (1996) 246-251.

[17] C. H. Cunningham, J. M. Pauly, K. S. Nayak, Saturated double-angle method for rapid $B_1^+$ mapping, Magn. Reson. Med. 55 (2006) 1326-1333.

[18] S. Akoka, F. Franconi, F. Seguin, A. Lepape, Radiofrequency map of an NMR coil by imaging, Magn. Reson. Imaging, 11 (1993) 437-441.

[19] A. Haase, Snapshot FLASH MRI-applications to $T_1$, $T_2$, and chemical-shift imaging, Magn. Reson. Med. 13 (1990) 77-89.

[20] V. L. Yarnkh, Actual flip angle imaging in the pulsed steady state: a method for rapid three-dimensional mapping of the transmitted radiofrequency field, Magn. Reson. Med. 57 (2007) 192-200.

[21] K. Nehrke, On the steady-state properties of actual flip angle imaging (AFI). Magn. Reson. Med. 61 (2009) 84-92.

[22] G. R. Morrell, A phase sensitive method of flip angle mapping, Magn. Reson. Med. 60 (2008) 889-894.

[23] N. G. Dowell, P. S. Tofts, Fast, accurate and precise mapping of the RF field in vivo using the 180 degrees signal null, Magn. Reson. Med, 58 (2007) 622-630.

[24] L. I. Sacolick, F. Wiesinger, I. Hancu, M. W. Vogel, $B_1$ mapping by Bloch-Siegert shift, Magn. Reson. Med. 63 (2010) 1315-1322.

[25] F. Bloch, A. Siegert, Magnetic resonance for nonrotating fields, Phys. Rev. 57 (1940) 522-527.

[26] M. Halse, D. J. Goodyear, B. MacMillan, P. Szomolanyi, D. Matheson, B. J. Balcom, Centric scan SPRITE magnetic resonance imaging, J. Magn. Reson. 165 (2003) 219-229.

[27] M. Halse, J. Rioux, S. Romanzetti, J. Kaffanke, B. MacMillan, I. Matikhin, N. J. Shah, E. Aubanel, B. J. Balcom, Centric scan SPRITE magnetic resonance imaging: optimization of SNR, resolution and relaxation time mapping, J. Magn. Reson. 169 (2004) 102-117.

[28] Q. Chen, M. Halse, B. J. Balcom, Centric scan SPRITE for spin density imaging of short relaxation time porous materials, Magn. Reson. Imaging. 23 (2005) 263-266.

[29] C. R. Meyer, P. H. Bland, J. Pipe, retrospective correction of intensity inhomogeneities in MRI. IEEE. Trans. Med. Imaging. 14 (1995) 36-41

[30] Z. Hou, A review on MR image intensity inhomogeneity correction, Int. J. Biomed. Imaging. 49515 (2006) 1-11.

[31] P. Irarrazabal, C. H. Meyer, D. G. Nishimura, A. Macovski, Inhomogeneity correction using an estimated linear fit map, Magn. Reson. Med. 35 (1996) 278-282.

[32] M. S. Cohen, R. M. Dubois, M. M. Zeineh, Rapid and effective correction of RF ihomogeneity for high field magnetic resonance imaging, Human Brain Mapping, (2000) 204-211

[33] J. D. Gispert, S. Reig, J. Pascau, J. J. Vaquero, P. Garcia-Barreno, M. Desco, Method for bias field correction of brain $T_1$ weighted magnetic resonance images minimizing segmentation error, Human brain mapping, 22 (2004), 133-144.

[34] K. R. Minard, R. A. Wind, Solenoidal microcoil design. Part 1. Optimizing rf homogeneity and coil dimensions, Concepts. Magn. Reson. 13 (2001) 128-142.

[35] H. Hui, M. Oullette, B. MacMillan, F. Goora, R. MacGregor, D. Green, B. Balcom, High pressure vessel magnetic resonance imaging with metallic vessels, J. Magn. Reson, 213 (2011) 90-97.

[36] J. P. Hornak, J. Szumowski, R. G. Bryant, Magnetic field mapping, Magn. Reson. Med. 6 (1988) 158-163.

[37] W. Liu, Ch. M. Collins, P. J. Delp, M. B. Smith, Effects of end-ring/Shield configuration on Homogeneity and signal-to-noise ratio in a birdcage-type coil loaded with human head, Magn. Reson. Med. 51 (2004) 217-221.

[38] M. Alecci, C. M. Collins, M. B. Smith, P. Jezzard, Radio frequency magnetic field mapping of a 3T birdcage coil: Experimental an theoretical dependence on sample properties, Magn. Reson. Med. 46 (2001) 379-385.

[39] C. E. Hayes, W. A. Edelstein, J. F. Schenck, O. M. Mueller and M. Eash, An efficient highly homogeneous radiofrequency coil for whole-body NMR imaging at 1.5 T. J. Magn. Reson., 63 (1985) 622-628.

[40] M. C. Leifer, Theory of the quadrature elliptic birdcage coil. *Magn. Reson. Med.*, 38 (1997) 732-767.

[41] C. E. Hayes, Birdcage and other high homogeneity RF coils for MR, *Encyclopedia of NMR*, Wiley, 1996, New York.

[42] F. D. doty, G. Jr. Entzminger, C. D. Hauck, J. P. Staab, Practical aspects of birdcage coils, J. Magn. Reson. 138 (1999) 144-154.

[43] J. Mispelter, M. Lupu, A. Briquet, NMR probeheads: for biophysical and biomedical experiments, theoretical principles & practical guidelines, Imperial College Press, 2006, 371-400, London.

[44] C. Wang, G. X. Shen, B1 field, and SNR comparisons for birdcage, TEM, and Microstrip coils at 7 T, J. Magn. Reson. Imaging. 24 (2006) 439-443

[45] C. M. Collins, S. Li, Q. X. Yang, M. B. Smith, A method for accurate calculation of $B_1$ fields in three dimensions. Effects of shield geometry on field strength and homogeneity in the birdcage coil, J. Magn. Reson. 125 (1997) 233-241.

[46] U.S. Environmental Protection Agency, Guidance on choosing a sample design for environmental data collection for use in developing a quality assurance project plan, Office of Environmental Information, Washington, D.C. 20460, December 2002.

[47] N. R. Drapper, H. Smith, Applied regression analysis, $3^{rd}$ edition, Wiley series in probability and statistics, New York (1998) 86-90.

We claim:

1. A method for measuring $B_1$ for an MRI sample space comprising:
   (a) providing a uniform object in the sample space;
   (b) generating an excitation pulse, the excitation pulse comprising a low flip angle and an RF pulse duration;
   (c) acquiring a signal from the excitation pulse wherein the signal is spatially encoded with a phase encode gradient;
   (d) measuring the intensity of the acquired signal;
   (e) repeating steps (b) to (d) while varying the phase encode gradient to obtain a phase encoded data set;
   (f) applying a Fourier transform to the phase encoded data set to generate an MRI image for the specific pulse duration;
   (g) varying the RF pulse duration and repeating steps (b) to (f);
   (h) calculating at least two ratios of the signal intensity to at least two different RF pulse durations; and
   (i) calculating a first slope using at least two of the ratios calculated in step (h), wherein the slope is dependent on $B_1^2$ for a first location in the object.

2. The method of claim 1 further comprising:
repeating the steps (b) to (i) while varying the pulse durations and phase encode gradients and calculating a second slope for a second location in the object.

3. The method of claim 2 further comprising:
plotting the first and second slopes and,
deriving the RF pulse shape data from the intercept of the plots of the first and second slopes with an axis representing the signal magnitude.

4. The method of claim 2 further comprising:
generating a relative $B_1$ map using the ratio of the first slope to the second slope.

5. The method of claim 4 further comprising:
providing an absolute value for $B_1$ for either the first or second location in the object and generating an absolute $B_1$ map.

6. The method of claim 5 further comprising:
modeling the effect of pulse length errors using the absolute $B_1$ map.

7. The method of claim 6 wherein the absolute $B_1$ map is in 3 dimensions.

8. The method of claim 2 further comprising:
calculating additional slopes for additional locations in the object by repeating the steps (b) to (i) and the step of generating a relative $B_1$ map using the ratio of the first slope to the second slope; and,
generating a relative $B_1$ map using ratios between the first, second and additional slopes.

9. A method correcting an MRI image of a non-uniform object comprising:
providing signal magnitude to position values for the image;
providing $B_1^2$ values for a plurality of locations in the object obtained using the steps of
   (a) generating an excitation pulse, the excitation pulse comprising a low flip angle and an RF pulse duration;
   (b) acquiring a signal from the excitation pulse wherein the signal is spatially encoded with a phase encode gradient;
   (c) measuring the intensity of the acquired signal;
   (d) repeating steps (a) to (c) while varying the phase encode gradient to obtain a phase encoded data set;
   (e) applying a Fourier transform to the phase encoded data set to generate an MRI image for the specific pulse duration;
   (f) varying the RF pulse duration and repeating steps (a) to (e);
   (q) calculating at least two ratios of the signal intensity to at least two different RF pulse durations; and
   (h) calculating a first slope using at least two of the ratios calculated in step (g), wherein the slope is dependent on $B_1^2$ for a first location in the object;
dividing the signal magnitude to position values by the $B_1^2$ values; and,
obtaining corrected signal magnitude to position values from the division operation,
wherein the signals are spatially encoded using a phase encoding selected from the group consisting of centric scan SPRITE, SPRITE and SPI.

10. The method of claim 9 wherein the non-uniform object is a reservoir rock sample.

11. A method of correcting signal intensity non-uniformities in an MRI image comprising:
   providing a $B_1$ values measured according to the steps of
   (a) providing a uniform object in the sample space;
   (b) generating an excitation pulse, the excitation pulse comprising a low flip angle and an RF pulse duration;
   (c) acquiring a signal from the excitation pulse wherein the signal is spatially encoded with a phase encode gradient;
   (d) measuring the intensity of the acquired signal;
   (e) repeating steps (b) to (d) while varying the phase encode gradient to obtain a phase encoded data set;
   (f) applying a Fourier transform to the phase encoded data set to generate an MRI image for the specific pulse duration;
   (g) varying the RF pulse duration and repeating steps (b) to (f);
   (h) calculating at least two ratios of the signal intensity to at least two different RF pulse durations; and
   (i) calculating a first slope using at least two of the ratios calculated in step (h), wherein the slope is dependent on $B_1^2$ for a first location in the object; and
   correcting the non-uniformities using the $B_1$ values.

* * * * *